(12) United States Patent
Chromczak

(10) Patent No.: US 9,576,625 B1
(45) Date of Patent: Feb. 21, 2017

(54) REGISTER INITIALIZATION USING MULTI-PASS CONFIGURATION

(71) Applicant: Altera Corporation, San Jose, CA (US)

(72) Inventor: Jeffrey Christopher Chromczak, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/878,958

(22) Filed: Oct. 8, 2015

(51) Int. Cl.
*G11C 7/12* (2006.01)
*G11C 7/20* (2006.01)
*G11C 7/10* (2006.01)

(52) U.S. Cl.
CPC . *G11C 7/20* (2013.01); *G11C 7/10* (2013.01); *G11C 7/12* (2013.01)

(58) Field of Classification Search
CPC .................................. G11C 7/12; G11C 8/16
USPC ........................................ 365/189.02, 230.05
See application file for complete search history.

(56) References Cited

U.S. PATENT DOCUMENTS

| 6,526,557 | B1* | 2/2003 | Young | H03K 19/17756 326/38 |
| 6,810,514 | B1* | 10/2004 | Alfke | G06F 17/5054 326/38 |
| 7,620,853 | B1* | 11/2009 | Kasnavi | G11C 29/025 714/42 |
| 2006/0132176 | A1 | 6/2006 | Lewis | |
| 2009/0282306 | A1* | 11/2009 | Ngo | H03K 19/17764 714/732 |
| 2010/0254203 | A1* | 10/2010 | Xu | H03K 19/0033 365/191 |
| 2013/0202061 | A1* | 8/2013 | Chandrasekaran | H04L 25/06 375/317 |
| 2013/0279242 | A1* | 10/2013 | Pedersen | G11C 7/20 365/156 |
| 2014/0258678 | A1* | 9/2014 | Rao | G06F 15/80 712/15 |
| 2016/0055102 | A1* | 2/2016 | de Cesare | G06F 12/1458 713/193 |

* cited by examiner

*Primary Examiner* — Michael Tran
(74) *Attorney, Agent, or Firm* — Fletcher Yoder, P.C.

(57) ABSTRACT

A method includes clearing configuration bits of a plurality of latches of an integrated circuit. The method also includes implementing an initialization routing pattern of the plurality of latches by configuring the configuration bits of the plurality of latches. The method further includes storing initialization data in a set of the plurality of latches based on the initialization routing pattern. The method includes clearing the configurations bit of the plurality of latches, wherein the initialization data remains stored in the set of the plurality of latches. The method also includes implementing a user-designed routing pattern of the plurality of latches by configuring the configuration bits of the plurality of latches.

20 Claims, 10 Drawing Sheets

| CRAM 1 | CRAM 0 | OUTPUT |
|---|---|---|
| 0 | 0 | CLK1 |
| 0 | 1 | CLK0 |
| 1 | 0 | VCC |
| 1 | 1 | VCC |

REGISTER INITIALIZATION USING MULTI-PASS CONFIGURATION

BACKGROUND

The present disclosure relates generally to integrated circuits, such as field programmable gate arrays (FPGAs). More particularly, the present disclosure relates to initializing registers (e.g., latches) of an integrated circuit (e.g., an FPGA) using multi-pass configuration.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

High-performance integrated circuits, such as FPGAs, may contain a large number of bypassable registers (e.g. latches). A user may implement a heavily pipe-lined circuit design on the integrated circuit and achieve high performance. The design may call for some or all of the registers in the integrated circuit to initialize in a specific state. This may be implemented using dedicated initialization hardware built into pipe-lined storage elements, such as using an address line to access transistors to write initialization data. However, dedicated initialization hardware costs silicon area. Additionally, there may be contention between the transistors and components of the registers (e.g., feedback inverters in each latch). Furthermore, testing of the dedicated initialization hardware may incur additional costs. It would be advantageous to initialize the registers without adding dedicated programming hardware to each latch.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate generally to integrated circuits, such as field programmable gate arrays (FPGAs). More particularly, the present disclosure relates to initializing registers of an integrated circuit (e.g., an FPGA) using multi-pass configuration. In a first pass, the present embodiments may clear configuration bits of an integrated circuit. An initialization routing pattern may be implemented on latches of the integrated circuit by configuring configuration bits of the latches. Initialization data may be stored in a set of the latches based on the initialization routing pattern. In a second pass, the present embodiments may clear the configuration bits of the latches, wherein the initialization data remains stored in the set of latches. A user-designed routing pattern may be implement on the latches by configuring the configuration bits of the latches. In particular, the user-designed routing pattern may determine whether each latch is enabled or bypassed, while each latch of the set of the latches may retain the initialization data based on the initialization routing pattern. The integrated circuit may then may operate based on the user-designed routing pattern. In this manner, the registers may be initialized without adding dedicated programming hardware to each latch.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with systemrelated and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Figure 1:
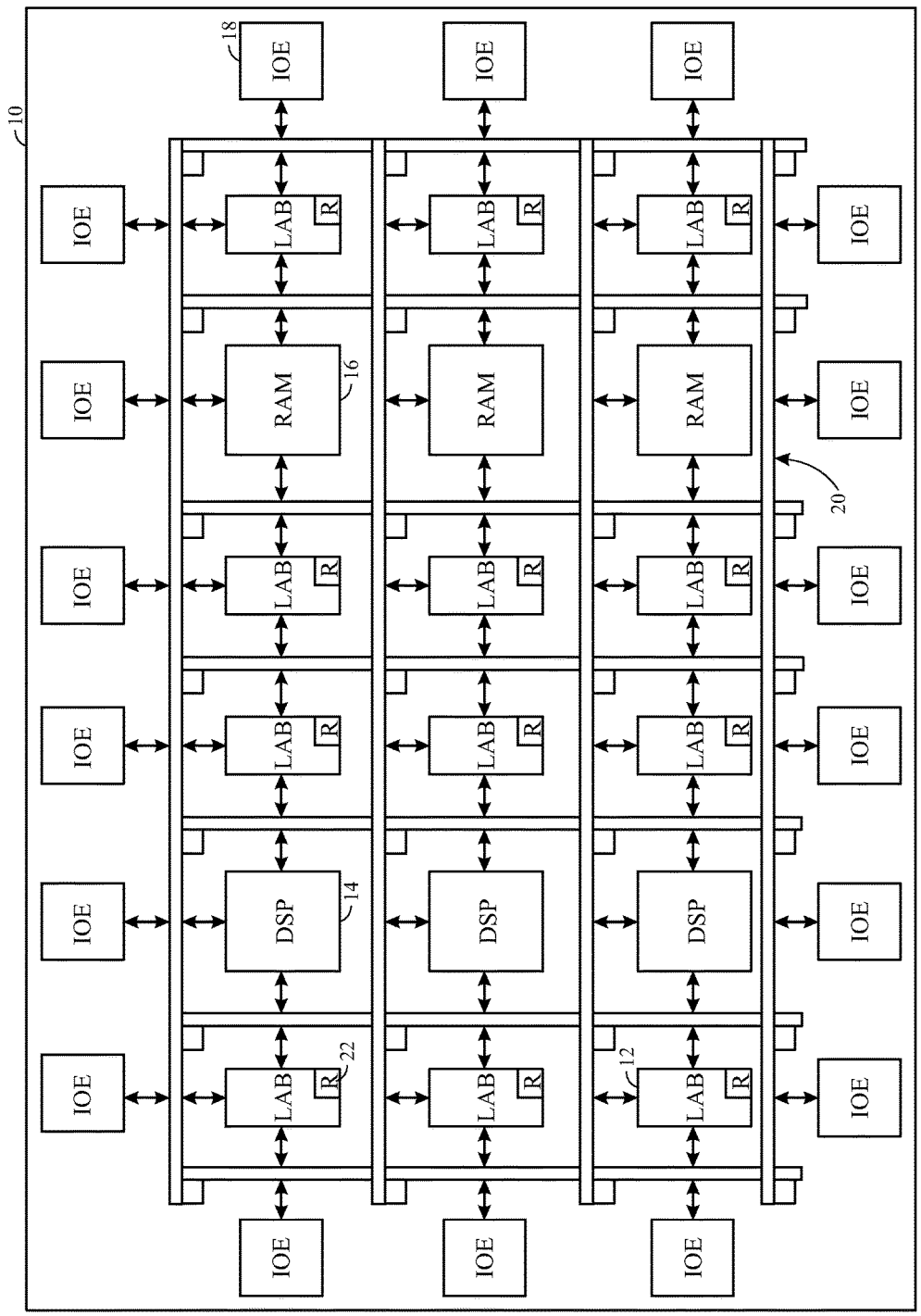
FIG. 1 is a block diagram of a field programmable gate array (FPGA) in accordance with an embodiment.

With the foregoing in mind, FIG. 1 is a block diagram of an integrated circuit 10 that may allow bypassable registers 22 to be initialized to a particular state without dedicated initialization hardware. In the examples that follow, the integrated circuit is described as a field programmable gate array (FPGA) 10. It may be appreciated, however, that the systems and methods of this disclosure may be employed with any suitable integrated circuit that includes a register 22 of a related form to those discussed further below. Thus, the integrated circuit of this disclosure may include the FPGA 10, any other suitable programmable logic device), or any suitable application-specific integrated circuit or processor, to name a few examples.

In the illustrated example of FIG. 1, the FPGA 10 may include logic array blocks (LABs) 12, digital signal processing (DSP) blocks 14, random access memory (RAM) blocks 16, input/output elements 18, and routing channels 20. Each LAB 12 may include one or more routing interfaces that may include one or more routing switches. Each routing switch may include one or more registers 22 and dedicated circuitry for arithmetic functions. The routing switches may include driver input multiplexers (DIMs), logic input multiplexers (LIMs), logic element input multiplexers (LEIMs), etc., such as those used in the Altera Stratix 10 FPGA made by Altera Corporation of San Jose, Calif. The DSP blocks 14 may include multiplier and/or accumulator functionality. The RAM 16 blocks may include various sizes of embedded RAM, such as 512 bit, 4 kbit, 576 kbit. The routing channels 20 may include wires that run vertically or horizontally and provide connections for various elements of the FPGA 10.

Figure 2:
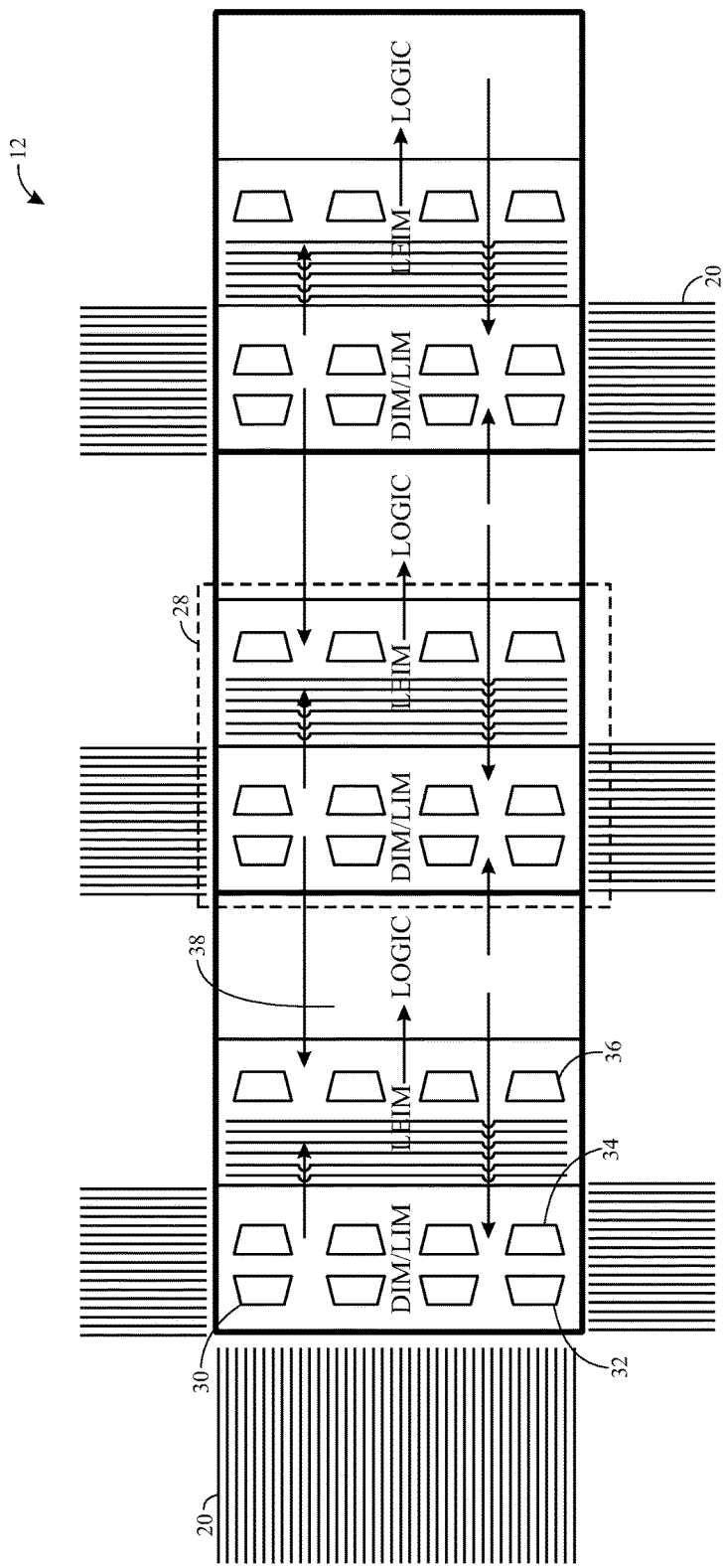
FIG. 2 is a schematic diagram that illustrates a logic array block (LAB) in accordance with an embodiment.

Turning now to FIG. 2, a schematic diagram illustrates an LAB 12 in accordance with an embodiment. The LAB 12 may include one or more routing interfaces 28. The routing interface 28 may include one or more routing switches 30, including DIMs 32, LIMs 34, and LEIMs 36, etc., such as used those in the Altera Stratix 10 FPGA. The routing switches 30 may be attached to a logic region 38 that may include programmable logic elements, such as lookup tables (LUTs). The LAB 12 may include routing channels 20 that may include wires that run vertically or horizontally and provide connections for various elements of the FPGA 10.

Figure 3:
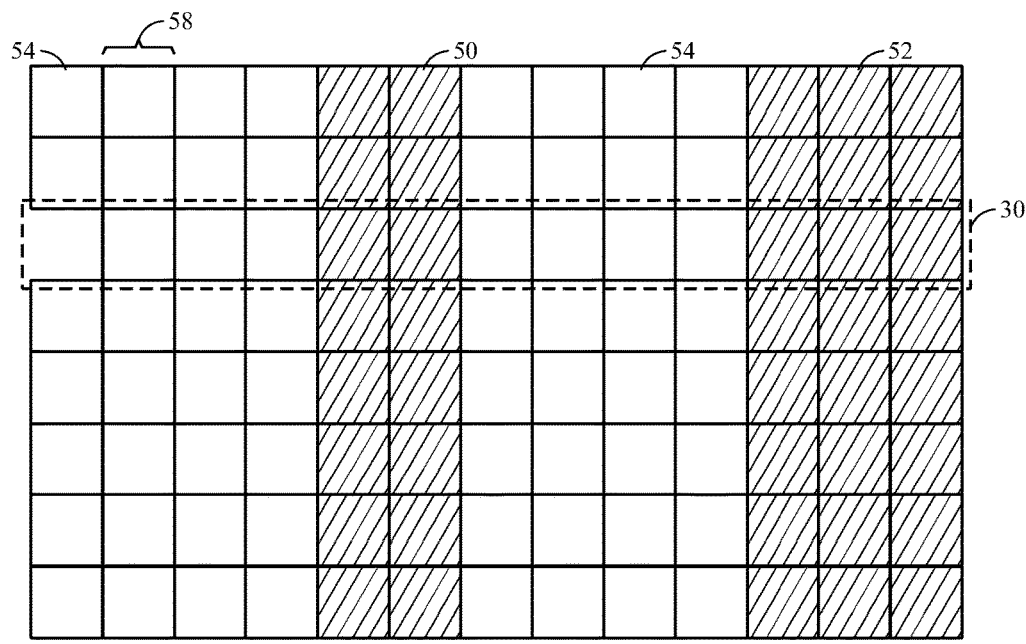
FIG. 3 is a schematic diagram that illustrates a portion of a routing interface in accordance with an embodiment.

FIG. 3 is a schematic diagram that illustrates a portion of a routing interface 28 in accordance with an embodiment. The routing interface 28 may include one or more routing switches 30. Each routing switch 30 may include a routing multiplexer 50, a routing driver 52, and one or more configuration bits (e.g., configuration RAM (CRAM) bits) 54. The routing multiplexers 50, routing drivers 52, and CRAM bits 54 of each routing switch 30 may be built as a distributed array in the routing interface 28. The CRAM bits 54 may be oriented in columns 58 in the routing interface 28. In some embodiments, the columns 58 of the CRAM bits 54 may be interleaved with columns of non-CRAM bits. The CRAM bits 54 controlling independent routing switches 30 may also be interleaved. In some embodiments, and as shown in FIG. 3, the CRAM bits 54 controlling a specific routing switch 30 may be adjacently positioned. The CRAM bits 54 may propagate as inputs to the routing multiplexer 50. The routing multiplexer 50 may in turn propagate as inputs to the routing drivers 52. The routing driver 52 may include a latch, such as a pulse latch, that may be configured to store data, depending on an input value. The latch may also be rendered transparent such that the input value passes through the latch. It may be appreciated that the systems and methods of this disclosure may be employed with any suitable latch that is a related form to those discussed further below, including, but not limited to, flip-flops, edge-triggered flip-flops, master-slave flip-flops, etc. As mentioned above, the design may call for some or all of the registers 22 in the FPGA 10 to initialize in a specific state in order to implement the user's designs. The registers 22 may include the latches of the routing drivers 52.

The FPGA 10 may be constructed such that each input of each latch may access specific initialization data by setting a small, predetermined set of CRAM bits 54 that do not affect the input or initialization state of any other latch. Additionally, a control logic of the latch may configure the latch to retain its state when the set of CRAM bits is cleared or when the set of CRAM bits is reconfigured (unless the reconfiguration loads a different value into the latch). As a result, each latch may be initialized using a multi-pass configuration, wherein a first pass loads each latch with initialization data of the user's design and a second pass loads the set of CRAM bits with a configuration used to implement a remainder of the user's design. Each routing multiplexer 50 may have a known logic high input and the first pass may configure each routing multiplexer 50 to pass the logic high input to a corresponding latch input.

Figure 4:
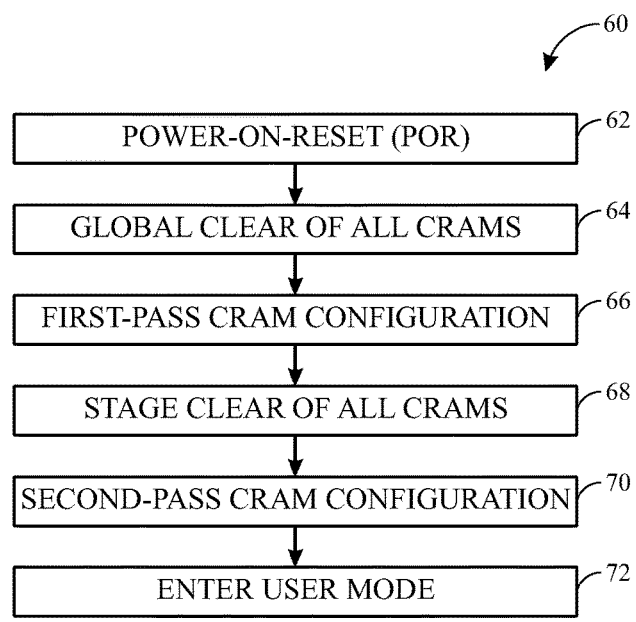
FIG. 4 is a flowchart illustrating a process for an FPGA to initialize its registers in accordance with an embodiment.

With the foregoing in mind, FIG. 4 is a flowchart illustrating a process 60 for the FPGA 10 to initialize its registers 22 in accordance with an embodiment. First, the FPGA 10 may enter a Power-On-Reset (POR) state 62. This may be a result of powering on or resetting the FPGA 10. Then, a global clear 64 of the CRAM bits 54 may be triggered by the FPGA power-up. The global clear 64 may also be re-triggered if supply voltages sag to a level where configuration or user state is lost. In particular, the global clear 64 may write a zero to every CRAM bit 54 on the FPGA 10. The FPGA 10 may then be in a state that is free of electrical contention. The global clear 64 may place each latch of the FPGA 10 into an enabled state (i.e., wherein each latch is enabled and may not be bypassed). The latches may be pulse latches, such as in the Altera Stratix 10 FPGA made by Altera Corporation of San Jose, Calif. It may be appreciated that the systems and methods of this disclosure may be employed with any suitable latch that is a related form to those discussed further below, including, but not limited to, flip-flops, edge-triggered flip-flops, master-slave flip-flops, etc. The global clear 64 may also tie off clock multiplexers of the FPGA 10 such that there are no clock transitions and no pulses are generated. Accordingly, because each pulse latch may be triggered by rising clock edges and the clock multiplexers of the FPGA 10 may be tied off, each pulse latch may stay in a closed state. In some embodiments, the global clear 64 may be followed by a register clear stage that globally resets all clocked storage elements in the FPGA 10.

The global clear 64 of the CRAM bits 54 may be followed by a first-pass CRAM bit configuration 66 wherein the latches of the routing drivers 52 may be initialized to an initialization state designed by the user. The CRAM bits 54 may be set to a pre-determined pattern that routes a known value to an input of each latch of each routing driver 52. One unique bit setting for each latch determines whether the latch is configured transparent (i.e., wherein the routed input initialization data passes through the latch) or stays in the default configuration (i.e., wherein the latch is closed). The FPGA 10 may include a common routing interface 30 that may be stamped out many times in a large array. Accordingly, the initialization routing pattern may include a repeated tile configuration (e.g., a template pattern that routes a logic high input to each latch) augmented with a latch control component (e.g., a small number of CRAM bits 54 of each latch such that one unique CRAM bit 54 setting per latch may determine if the corresponding latch is configured transparent to pass an input value or stays closed to hold a clear value). The initialization routing pattern may be compressed and stored external to the FPGA 10 (i.e., off-chip) to limit the amount of storage used. The repeated tile portion of the initialization routing pattern may also be compressed and stored on the FPGA 10 (i.e., on-chip) to limit I/O traffic during the first-pass CRAM bit configuration 66. The latch control component may also be compressed because the component may be sparsely used (e.g. set bits may be limited to a small fraction of latches that are used and powered up as high).

When the first-pass CRAM bit configuration 66 is complete, the FPGA 10 may undergo a staged clear 68 of its CRAM bits 54 to enable more precise control over clear order and prevent the latches from storing incorrect data. For address frames of the FPGA 10 that do not include both the CRAM bits 54 of the routing multiplexers and the CRAM bits 54 of the latches, the staged clear 68 may clear the address frames that include the CRAM bits 54 of the latches before clearing the address frames that include the CRAM bits 54 of the routing multiplexers. For address frames of the FPGA 10 that include both the CRAM bits 54 of the routing multiplexers and the CRAM bits 54 of the latches, the staged clear 68 may clear multiple address frames that include both the CRAM bits 54 of the latches and the CRAM bits 54 of the routing multiplexers. Advantageously, the FPGA 10 may undergo further staged clears 68 of CRAM bits 54 such that the registers 22 of the FPGA 10 may be reset to the default state while retaining the initial input values stored during the first-pass CRAM bit configuration 66. The staged clear 68 of the CRAM bits 54 may be followed by a second-pass CRAM bit configuration 70 wherein the latches of the routing drivers 52 may be configured to a user design. Specifically, the user design may determine whether each latch is enabled or bypassed, while each latch may retain the initial input values stored during the first-pass CRAM bit configuration 66. The FPGA 10 may enter a user mode 72. In the user mode, the FPGA 10 may operate based on a configuration designed by the user.

Figure 5:
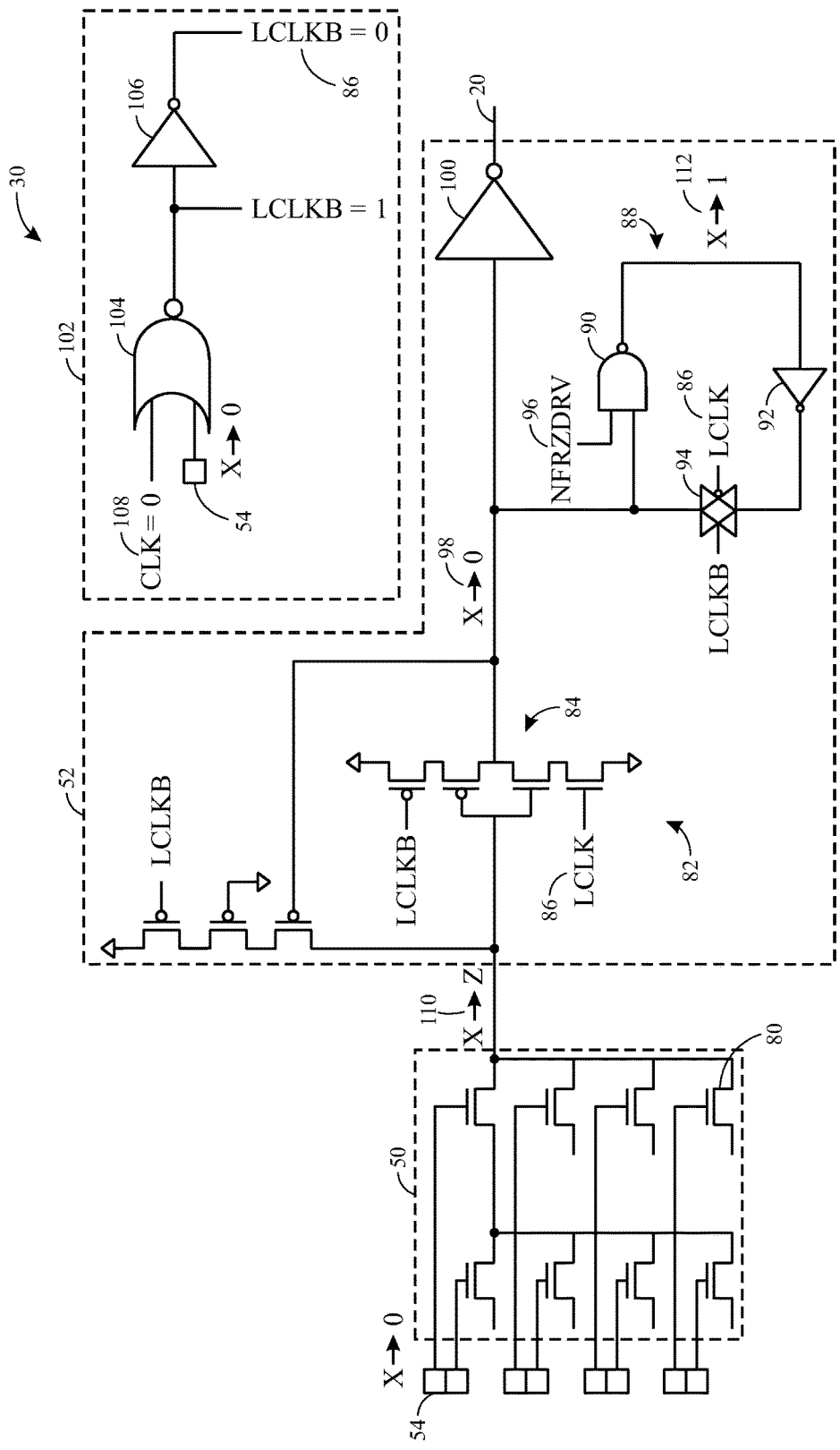
FIG. 5 is a circuit diagram of a routing switch of an FPGA that illustrates signal transitions during a global clear of the configuration random access memory (CRAM) bits in accordance with an embodiment.

With the foregoing in mind, FIG. 5 is a circuit diagram of the routing switch 30 of the FPGA 10 that illustrates signal transitions during the global clear 64 of the CRAM bits 54 in accordance with an embodiment. The routing switch 30 may include one or more CRAM bits 54. The CRAM bits 54 may be propagated as inputs to the routing multiplexer 50. The routing multiplexer 50 may include pass gates 80, such as negative metal-oxide semiconductor (NMOS) pass transistors. An output of the routing multiplexer 50 may propagate as an input to the routing driver 52. The routing driver 52 may include a combinational buffer 82 that may include one or more tri-stated circuits or inverters 84 that include local clock signals 86 as inputs. The routing driver 52 may include a latch 88, such as a pulse latch. It may be appreciated that the systems and methods of this disclosure may be employed with any suitable latch that is a related form to those discussed further below, including, but not limited to, flip-flops, edge-triggered flip-flops, master-slave flip-flops, etc. The latch 88 may include a gate 90 (e.g., a NAND gate), a buffer or inverter 92, and a pass gate 94, such as a complementary metal-oxide semiconductor (CMOS) pass transistor. The pass gate 94 may include the local clock signals 86 as inputs. The gate 90 may include a NAND freeze drive signal 96 (i.e., nfrzdrv) and an input from a storage node 98 as inputs. The nfrzdrv signal 96 may freeze the output of the gate 90 when it has a logic low value. The routing driver 52 may also include a buffer circuit 100. The local clock signals 86 may be provided by a clock select circuit 102 that may include a gate 104 (e.g., a NOR gate) and a buffer or inverter 106. The gate 104 may include a clock signal 108 and the CRAM bit 54 as inputs.

During the global clear 64 of the CRAM bits 54, the value of the CRAM bits 54 may transition to a logic low value. A node 110 between the routing multiplexer 50 and the routing driver 52 may transition to a high impedance (e.g., hi-Z or floating) value. The storage node 98 between the combinational buffer 82 and the latch 88 may transition to the logic low value. The nfrzdrv signal 96 may also transition to a low logic value. The latch node 112 between the gate 90 and the buffer or inverter 92 of the latch 88 may transition to a logic high value. Accordingly, following the global clear 64, each latch 88 of each LE may be in a default clear state storing the logic low value.

The global clear 64 of the CRAM bits 54 may be followed by the first-pass CRAM bit configuration 66 wherein the latches 88 of the routing drivers 52 may be initialized to an initialization state designed by the user. The CRAM bits 54 may be set to a pre-determined pattern that routes a known value to an input of each latch 88 of each routing driver 52. One unique bit setting for each latch 88 determines whether the latch 88 is configured transparent (i.e., wherein the routed input initialization data passes through the latch 88) or stays in the default configuration (i.e., wherein the latch 88 is closed). The FPGA 10 may include one common routing interface 30 that may be stamped out many times in a large array. Accordingly, the initialization routing pattern may include a repeated, single tile configuration (e.g., a template pattern that routes a logic high input to each latch 88) augmented with a latch control component (e.g., a small number of CRAM bits 54 of each latch 88 such that one unique CRAM bit 54 setting per latch 88 may determine if the corresponding latch 88 is configured transparent to pass an input value or stays closed to hold a clear value). The initialization routing pattern may be compressed and stored external to the FPGA 10 (i.e., off-chip) to limit the amount of storage used. The repeated tile portion of the initialization routing pattern may also be compressed and stored on the FPGA 10 (i.e., on-chip) to limit I/O traffic during the first-pass CRAM bit configuration 66. The latch control component may also be compressed because the component may be sparsely used (e.g. set bits may be limited to a small fraction of latches 88 that are used and powered up as high).

Figure 6:
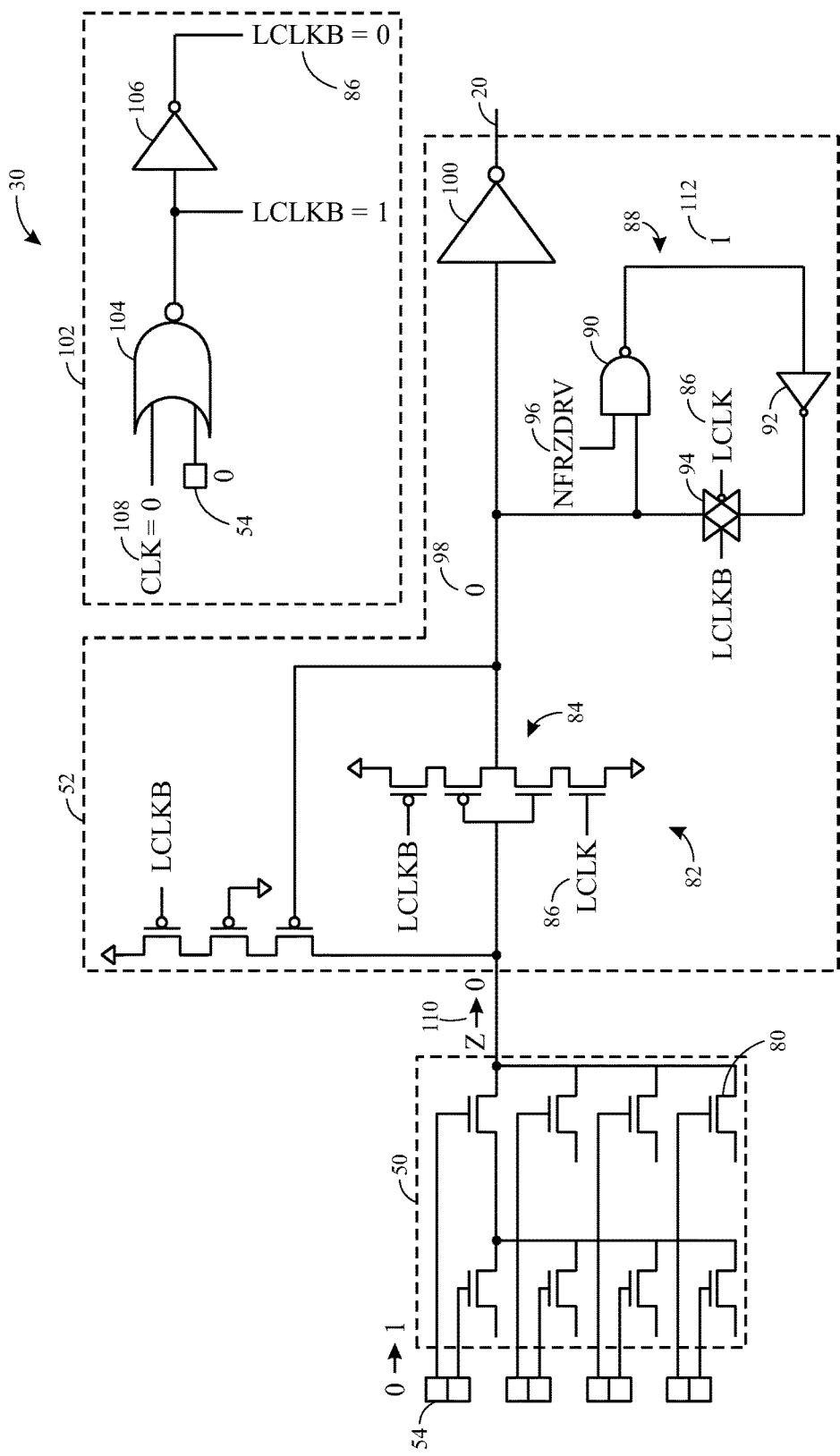
FIG. 6 is a circuit diagram of a routing switch of an FPGA that illustrates signal transitions during a first-pass CRAM bit configuration for registers that initialize low or may not be desired to be initialized in accordance with an embodiment.

With the foregoing in mind, FIG. 6 is a circuit diagram of the routing switch 30 of the FPGA 10 that illustrates signal transitions during the first-pass CRAM bit configuration 66 for registers 22 that initialize low or may not be desired to be initialized (e.g., unused registers and registers that may be bypassed) in accordance with an embodiment. Each latch 88 that initializes low or may not be desired to be initialized may be left in the default clear state. In particular, the value of the CRAM bits 54 may retain the logic low value. The node 110 between the routing multiplexer 50 and the routing driver 52 may transition to the logic low value. The storage node 98 between the combinational buffer 82 and the latch 88 may retain the logic low value. The latch node 112 between the gate 90 and the buffer or inverter 92 of the latch 88 may retain the logic high value.

Figure 7:
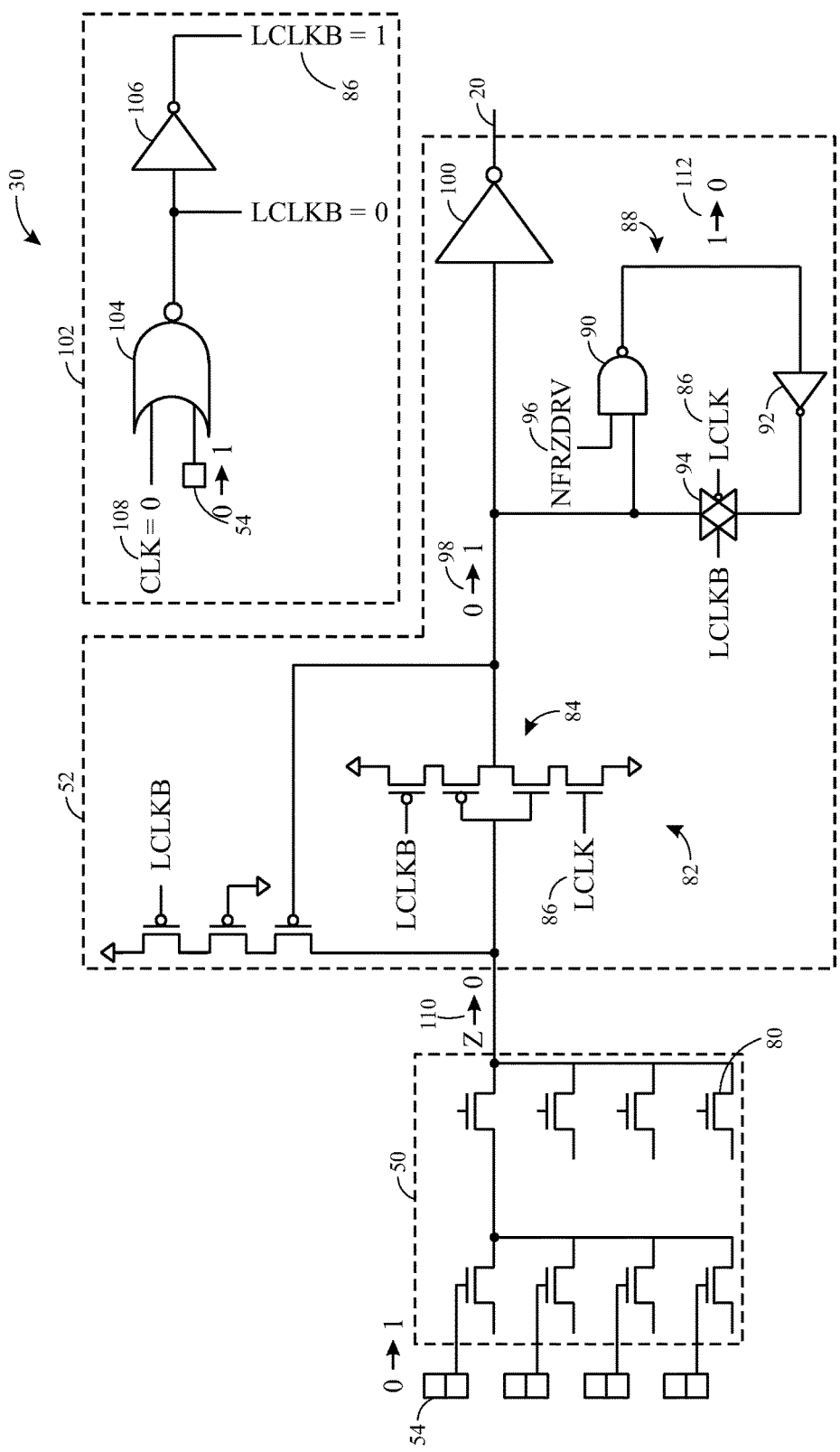
FIG. 7 is a circuit diagram of a routing switch of an FPGA that illustrates signal transitions during a first-pass CRAM configuration for registers that initialize high in accordance with an embodiment.

Turning now to FIG. 7, a circuit diagram of the routing switch 30 of the FPGA 10 that illustrates signal transitions during the first-pass CRAM configuration for registers 22 that initialize high in accordance with an embodiment. Each latch 88 that initializes high may use the same configuration as a latch 88 that initializes low for all bits except for the CRAM bit 54 that forces the latch 88 transparent. In particular, the value of each CRAM bit 54 may transition to the logic high value. The node 110 between the routing multiplexer 50 and the routing driver 52 may transition to the logic low value. The storage node 98 between the combinational buffer 82 and the latch 88 may transition to the logic high value. The latch node 112 between the gate 90 and the buffer or inverter 92 of the latch 88 may transition to the logic low value.

Figure 8:
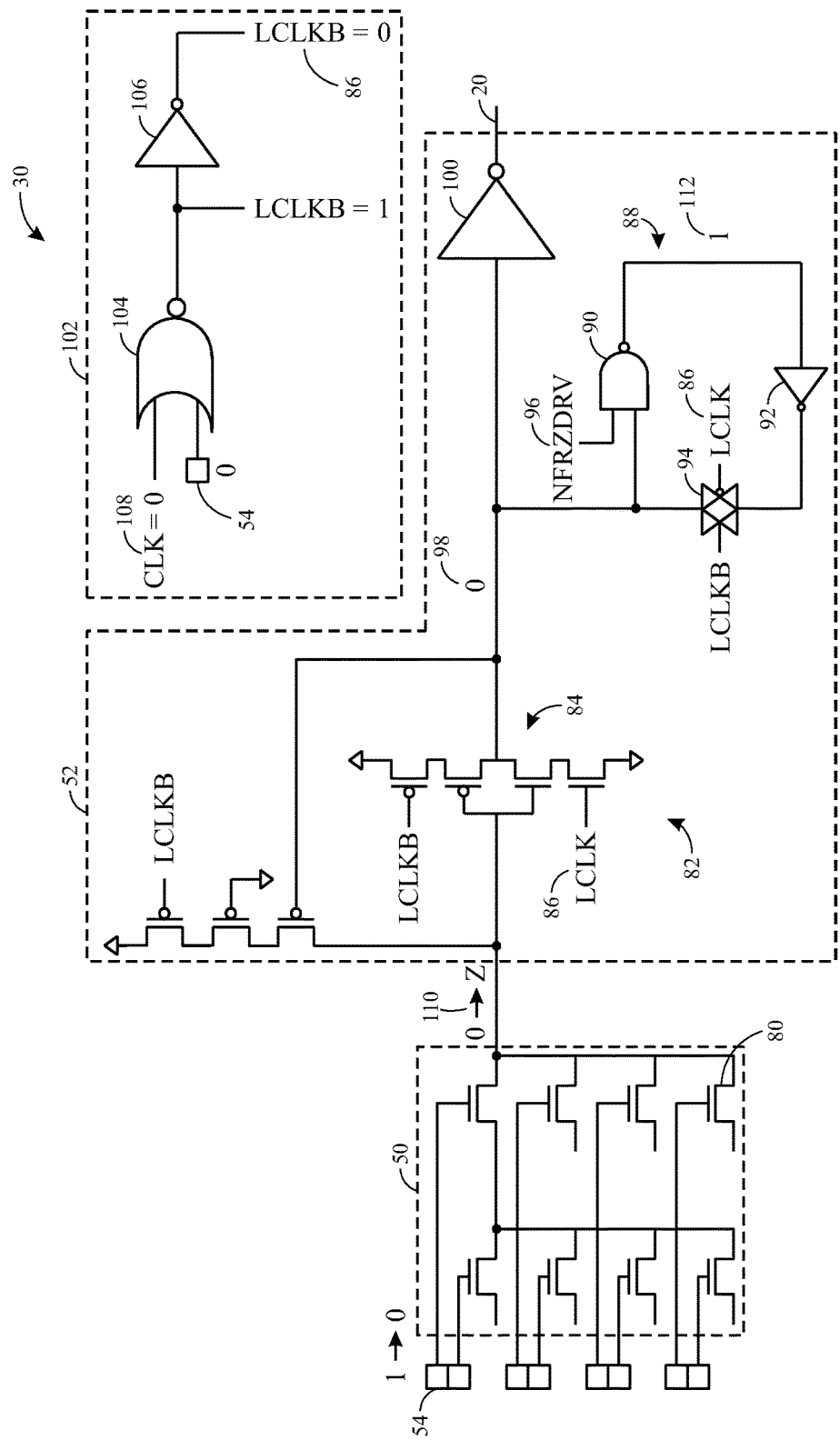
FIG. 8 is a circuit diagram of a routing switch of an FPGA that illustrates a post-first-pass CRAM configuration and post-staged clear of CRAM bits state of a register that initialized low in accordance with an embodiment.

The latches 88 that were left cleared during the first-pass CRAM configuration 66 may remain closed and retain the logic low value. With this in mind, FIG. 8 is a circuit diagram of the routing switch 30 of the FPGA 10 that illustrates a post-first-pass CRAM configuration and post-staged clear 68 of CRAM bits 54 state of the register 22 that initialized low in accordance with an embodiment. In particular, the value of the CRAM bits 54 may clear to the logic low value while a state of the latch 88 remains unchanged. The node 110 between the routing multiplexer 50 and the routing driver 52 may transition to the high impedance (e.g., hi-Z or floating) value. The storage node 98 between the combinational buffer 82 and the latch 88 may retain the logic low value. The latch node 112 between the gate 90 and the buffer or inverter 92 of the latch 88 may retain the logic low value.

Figure 9:
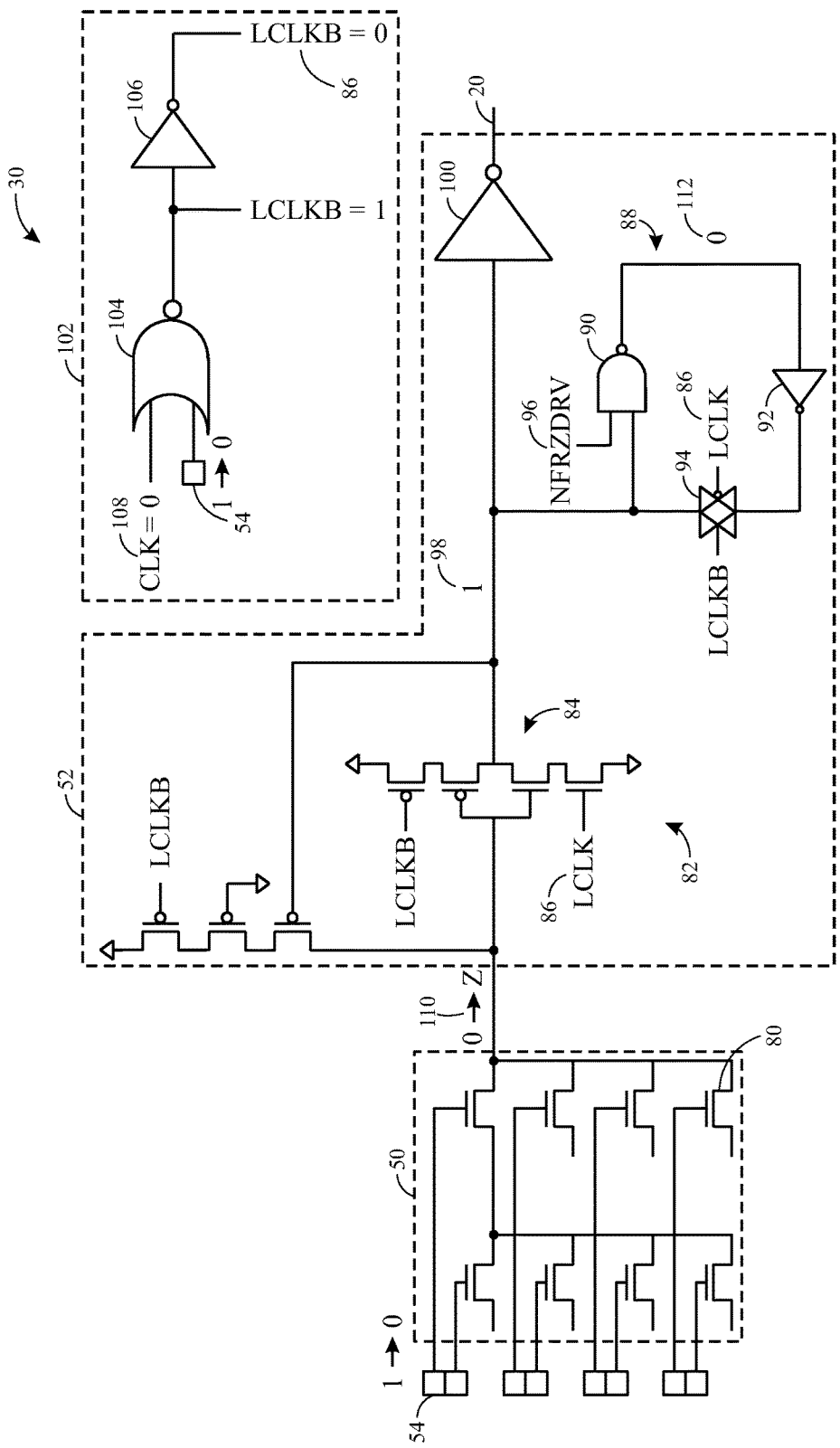
FIG. 9 is a circuit diagram of a routing switch of an FPGA that illustrates a post-first-pass CRAM configuration state of a register that initialized high in accordance with an embodiment.

The latches 88 that were initialized high during the first-pass CRAM configuration 66 may have their CRAM bits 54 cleared. Accordingly, the initialization input value may be retained in the closed latch 88. With this in mind, FIG. 9 is a circuit diagram of the routing switch 30 of the FPGA 10 that illustrates a post-first-pass CRAM configuration state of the register 22 that initialized high in accordance with an embodiment. In particular, the value of the CRAM bits 54 may transition to the logic low value. The node 110 between the routing multiplexer 50 and the routing driver 52 may transition to the high impedance (e.g., hi-Z or floating) value. The storage node 98 between the combinational buffer 82 and the latch 88 may retain the logic high value. The latch node 112 between the gate 90 and the buffer or inverter 92 of the latch 88 may retain the logic low value.

Figures 10, 11:
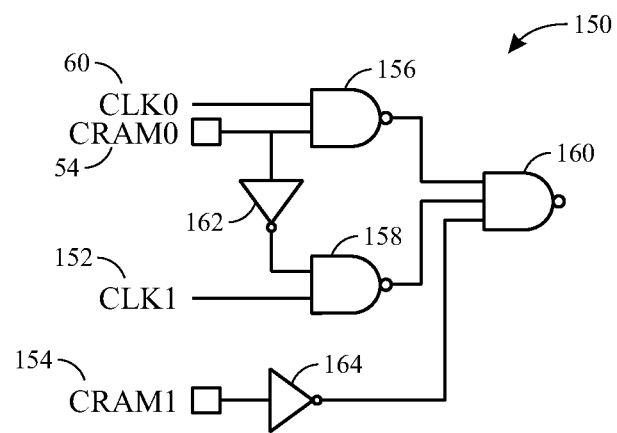
FIG. 10 is a circuit diagram of a control logic for a routing switch with more than one clock signal input in accordance with an embodiment.
FIG. 11 is a chart illustrating states of the control logic in accordance with an embodiment.

In the embodiments discussed above, each routing switch 30 includes a single clock signal 108 input, such as in the case of the logic input multiplexer (LIM) or the logic element multiplexer (LEIM), both used in the Altera Stratix 10 FPGA made by Altera Corporation of San Jose, Calif. However, in some embodiments, the routing switch 30 may have more than one clock signal 108 input. For example, the driver input multiplexer (DIM), also used in the Altera Stratix 10 FPGA, includes two clock signal 60 inputs. FIG. 10 is a circuit diagram of a control logic 150 for a routing switch 30 with more than one clock signal 60 input in accordance with an embodiment. The control logic 150 is implemented such that the corresponding latch 88 may transition from transparent to the default clear state without losing its initialization data. Input signals to the control logic 150 may include a first clock signal 60, a second clock signal 152, a first CRAM bit 54, and a second CRAM bit 154. The control logic 150 may be constructed with three gates (e.g., NAND gates) 156, 158, 160 and two buffers or inverters 162, 164. FIG. 11 is a chart 170 illustrating states of the control logic 150 in accordance with an embodiment. The two CRAM bits 54, 154 may output one of three non-redundant states 172, the first clock signal 60, the second clock signal 152, or the input signal (i.e., VCC) 174 that may force the latch 44 transparent.

If the CRAM bits 54 of the routing switch 30 with the more than one clock signal 60 are not cleared in a certain correct order, the routing switch 30 may store incorrect data. For example, if the CRAM bits 54 of the routing multiplexer 50 of the routing switch 30 with the more than one clock signal 60 clear to zero before the CRAM bits 54 of the control logic 150 of the routing switch 30, then the routing multiplexer pass gates 80 may be turned off and the input to the latch 88 of the routing switch 30 may be left floating. A tri-state driver 84 in the routing driver 52 during the first-pass CRAM configuration 66 may still be enabled (i.e., because the CRAM bit 54 has not yet been cleared) with an uncontrolled value on its high-impedance input 110 and an uncontrolled value driven to its output node 98. The result is that the state of the storage node 98 between the combinational buffer 82 and the latch 88 may be changed and the programmed initialization data lost. When the CRAM bit 54 is cleared, the latch 88 stores incorrect data.

To prevent the latch 88 from storing incorrect data, a staged clear 68 of the CRAM bits 54 after the first-pass CRAM bit configuration 66 may enable more precise control over clear order to prevent the latches from storing incorrect data. For distributed routing multiplexers 50 that may span many address frames, the address frames that include the CRAM bits 54 of the latches 88 may be cleared before clearing the address frames that include the CRAM bits 54 of the routing multiplexers 50 in order to prevent storing incorrect data. For more compact routing multiplexers 50, however, this may not be possible. In such cases, the CRAM bits 54 of the latches 88 and the CRAM bits 54 of the routing multiplexers 50 may be assigned to a same address frame. If multiple address frames that include both the CRAM bits 54 of the latches 88 and the CRAM bits 54 of the routing multiplexers 50 are cleared in a single cycle, data line drivers corresponding to columns in the address frame that contain the CRAM bits 54 of the routing multiplexers 50 that are set in the initialization routing pattern may see maximum load (i.e., with all accessed bits set) and, accordingly, clear time may be longer. However, half or less of the CRAM bits 54 of the latches 88 are set because only one of two of the CRAM bits 54 for each latch 88 may be set. Moreover, the number of CRAM bits 54 of the latches 88 that are set may be much lower, because only a small fraction of switches of the FPGA 10 may be used as latches 88 that must power-up high. As a result, data line drivers corresponding to columns in the address frame that contain the CRAM bits 54 of the latches 88 will see a smaller load than the CRAM bits 54 of the routing multiplexers 50 and, accordingly, the CRAM bits 54 of the latches 88 may clear earlier as desired. Advantageously, the FPGA 10 may undergo further staged clears of CRAM bits 36 such that the registers 22 of the FPGA 10 may be reset to the default state while retaining initial conditions. It is envisioned that the staged clears may include any general technique that enables the CRAM bits 54 of the FPGA 10 to be cleared, including techniques that enable a first column 58 of CRAM bits 54 to clear faster or slower than a second column 58 of CRAM bits (e.g., through the use of stronger or more powerful data line drivers corresponding to certain columns 58 of CRAM bits 43, data lines with lower resistance corresponding to certain columns 58 of CRAM bits 43, etc.).

The staged clear 68 of the CRAM bits 54 may be followed by a second-pass CRAM bit configuration 70 wherein the latches of the routing drivers 52 may be configured to a state designed by the user. The FPGA 10 may enter a user mode 72. In the user mode, the FPGA 10 may operate based on the state designed by the user.

Figure 12:
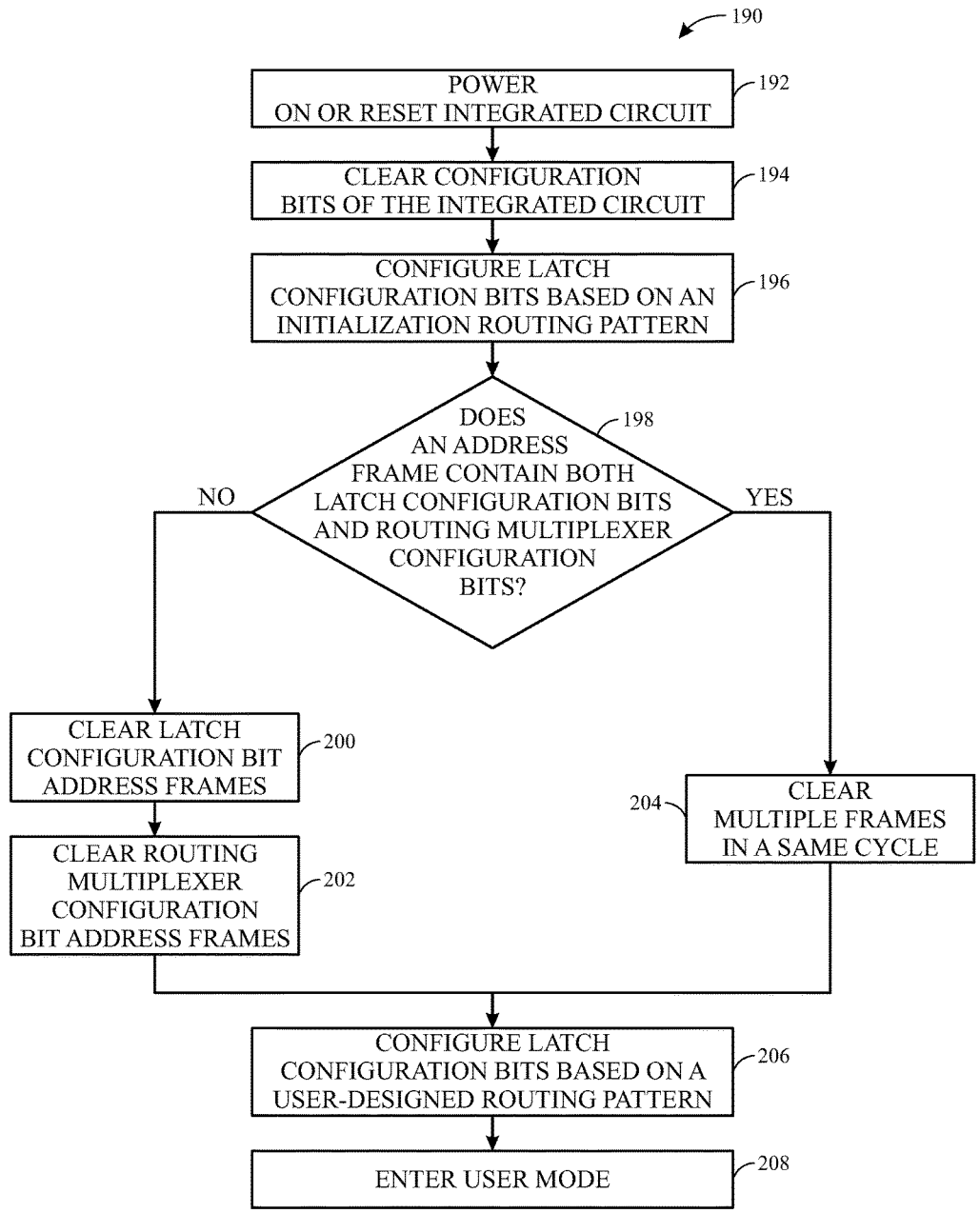
FIG. 12 is a flowchart illustrating a method to initialize registers of an integrated circuit using a multi-pass configuration in accordance with an embodiment.

Turning now to FIG. 12, a flowchart illustrating a method 190 to initialize registers 22 of an integrated circuit 10 (e.g., FPGA) using a multi-pass configuration in accordance with an embodiment. The method 190 may power on or reset (block 192) an integrated circuit 10. In some embodiments, the integrated circuit 10 enters a Power-On-Reset (POR) state. The method 190 may then globally clear (block 194) configuration bits (e.g., CRAM bits) 54 of the integrated circuit 10. The global clear (block 194) of the configuration bits 54 may be triggered by the integrated circuit 10 powering up. The global clear (block 194) may also be re-triggered if supply voltages sag to a level where configuration or user state is lost. In particular, the global clear (block 194) may write a zero to every configuration bit 54 on the integrated circuit 10. The integrated circuit 10 may then be in a state that is free of electrical contention. The global clear (block 194) may place each latch 88 of each routing driver 52 of the integrated circuit 10 into an enabled state (i.e., wherein each latch 88 is enabled and may not be bypassed). The latches 88 may be pulse latches, such as in the Altera Stratix 10 FPGA made by Altera Corporation of San Jose, Calif. It may be appreciated that the systems and methods of this disclosure may be employed with any suitable latch that is a related form to those discussed further below, including, but not limited to, flip-flops, edge-triggered flip-flops, master-slave flip-flops, etc. The global clear (block 194) may also tie off clock multiplexers of the integrated circuit 10 such that there are no clock transitions and no pulses are generated. Accordingly, because each pulse latch 88 may be triggered by rising clock edges and the clock multiplexers of the integrated circuit 10 may be tied off, each pulse latch 88 may stay in a closed state. In some embodiments, the global clear (block 194) may be followed by a register clear stage that globally resets all clocked storage elements in the integrated circuit 10.

The method 190 may configure (block 196) configuration bits 54 of each latch 88 based on an initialization routing pattern designed by the user. The latch configuration bits 54 may be set to a pre-determined pattern that routes a known value to an input of each latch of each routing driver 52. One unique configuration bit setting for each latch 88 determines whether the latch 88 is configured transparent (i.e., wherein the routed input initialization data passes through the latch 88) or stays in the default configuration (i.e., wherein the latch 88 is closed). The integrated circuit 10 may include a common routing switch 30 that may be stamped out many times in a large array. Accordingly, the initialization routing pattern may include a repeated tile configuration (e.g., a template pattern that routes a logic high input to each latch 88) augmented with a latch control component (e.g., a small number of latch configuration bits 54 such that one unique configuration bit setting per latch 88 may determine if the corresponding latch 88 is configured transparent to pass an input value or stays closed to hold a clear value). The initialization routing pattern may be compressed and stored external to the integrated circuit 10 (i.e., off-chip) to limit the amount of storage used. The repeated tile portion of the initialization routing pattern may also be compressed and stored on the integrated circuit 10 (i.e., on-chip) to limit I/O traffic during the configuration (block 196). The latch control component may also be compressed because the component may be sparsely used (e.g. set bits may be limited to a small fraction of latches 88 that are used and powered up as high).

The integrated circuit 10 may then undergo a staged clear of its configuration bits 54 to enable more precise control over clear order and prevent the latches 88 from storing incorrect data. The method 190 may first determine whether each address frame of the integrated circuit 10 contain (node 198) both latch configuration bits 54 and routing multiplexer configuration bits 54. For address frames of the integrated circuit 10 that do not include both the latch configuration bits 54 and the routing multiplexer configuration bits 54, the method 190 first clears (block 200) the address frames that include the latch configuration bits 54 and then clears (block 202) the address frames that include the routing multiplexer configuration bits 54. For address frames of the integrated circuit 10 that include both the latch configuration bits 54 and the routing multiplexer configuration bits 54, the method 190 may clear multiple address frames that include both the latch configuration bits 54 and the routing multiplexer configuration bits 54 in a single cycle. Advantageously, the integrated circuit 10 may undergo further staged clears of configuration bits 54 such that the registers 22 of the integrated circuit 10 may be reset to the default state while retaining the initial input values stored during the configuration (block 196).

The method 190 may next configure (block 206) the latch configuration bits 54 based on a user-designed routing pattern. The integrated circuit 10 may enter (block 208) a user mode. In the user mode, the integrated circuit 10 may operate based on the user-designed routing pattern.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A method, comprising:
   clearing configuration bits of a plurality of latches of an integrated circuit during a first pass of the configuration bits;
   setting the configuration bits of the plurality of latches to implement an initialization routing pattern of the plurality of latches;
   storing initialization data in a set of the plurality of latches based on the initialization routing pattern;
   clearing the configuration bits of the plurality of latches during a second pass of the configuration bits, wherein the initialization data remains stored in the set of the plurality of latches; and
   setting the configuration bits of the plurality of latches to implement a user-designed routing pattern of the plurality of latches.

2. The method of claim 1, comprising entering a power-or-reset state by powering on or resetting the integrated circuit.

3. The method of claim 1, comprising entering a user mode based on the user-designed routing pattern such that a user may operate the integrated circuit.

4. The method of claim 1, wherein the configuration bits comprise configuration random access memory bits.

5. The method of claim 1, wherein when a predetermined set of the configuration bits of a respective latch of the set of the plurality of latches is set, each input of the respective latch is configured to access the initialization data and each input of any remaining latches of the plurality of latches are unaffected.

6. The method of claim 1, wherein the initialization data remains stored in the set of latches of the plurality of latches when the configuration bits of the set of latches are cleared.

7. The method of claim 6, wherein the initialization data remains stored in the set of latches of the plurality of latches when the configuration bits of the set of latches are reconfigured, unless a value is loaded into a latch of the set of latches different than a current value of the latch.

8. An integrated circuit, comprising:
a plurality of configuration bits;
a plurality of routing switches comprising:
  one or more latches, wherein each latch comprises one or more of the configuration bits; and
  one or more routing multiplexers, wherein each routing multiplexer comprises one or more of the configuration bits;
wherein the integrated circuit is configured to:
  clear each configuration bit of the integrated circuit during a first pass of the configuration bits;
  set the configuration bits of the plurality of latches to implement an initialization routing pattern of the one or more latches;
  store initialization data in a set of the one or more latches based on the initialization routing pattern;
  clear the one or more configuration bits of the one or more latches during a second pass of the configuration bits, wherein the initialization data remains stored in the set of the one or more latches; and
  set the configuration bits of the plurality of latches to implement a user-designed routing pattern of the one or more latches.

9. The integrated circuit of claim 8, wherein each input of the set of the one or more latches is configured to access the initialization data and each input of any remaining latches of the one or more latches are unaffected.

10. The integrated circuit of claim 8, wherein the initialization data remains stored in the set of the one or more latches when the one or more configuration bits of the set of the one or more latches are cleared.

11. The integrated circuit of claim 10, wherein the initialization data remains stored in the set of the one or more latches when the one or more configuration bits of the set of the one or more latches are reconfigured, unless a value is loaded into a latch of the set of the one or more latches different than a current value of the latch.

12. The integrated circuit of claim 8, wherein the plurality of routing switches comprise driver input multiplexers, logic input multiplexers, or logic element input multiplexers.

13. The integrated circuit of claim 8, wherein clearing the one or more configuration bits of the one or more latches comprises clearing each address frame of the one or more configuration bits of the one or more latches before clearing an address frame of the one or more configuration bits of the one or more routing multiplexers.

14. The integrated circuit of claim 8, wherein a plurality of address frames of the integrated circuit are cleared in a single cycle when each address frame comprises the one or more configuration bits of the one or more latches and the one or more configuration bits of the one or more routing multiplexers.

15. A tangible, non-transitory, machine-readable-medium, comprising machine readable instructions to:
clear configuration bits of an integrated circuit during a first pass of the configuration bits, wherein the integrated circuit comprises a plurality of routing switches, wherein the plurality of routing switches comprise one or more latches, wherein the one or more latches comprise the configuration bits;
set the configuration bits to implement an initialization routing pattern of the one or more latches;
store initialization data in a set of the one or more latches based on the initialization routing pattern;
clear the configuration bits during a second pass of the configuration bits, wherein the initialization data remains stored in the set of the one or more latches; and
set the configuration bits to implement a user-designed routing pattern of the one or more latches.

16. The machine-readable-medium of claim 15, wherein each input of the set of the one or more latches is configured to access the initialization data and each input of any remaining latches of the one or more latches are unaffected.

17. The machine-readable-medium of claim 15, the initialization data remains stored in the set of the one or more latches when the configuration bits of the set of the one or more latches are cleared.

18. The machine-readable-medium of claim 17, wherein the initialization data remains stored in the set of the one or more latches when the configuration bits of the set of the one or more latches are reconfigured, unless a value is loaded into a latch of the set of the one or more latches different than a current value of the latch.

19. The machine-readable-medium of claim 15, wherein the initialization routing pattern is compressed and stored.

20. The machine-readable-medium of claim 15, wherein the initialization routing pattern comprises a repeated tile configuration and a latch control component.

* * * * *